(12) United States Patent
Kubota et al.

(10) Patent No.: US 10,665,416 B2
(45) Date of Patent: May 26, 2020

(54) SUBSTRATE PROCESSING APPARATUS

(71) Applicant: Tokyo Electron Limited, Tokyo (JP)

(72) Inventors: Shinji Kubota, Miyagi (JP); Naohiko Okunishi, Miyagi (JP); Yosuke Tamuro, Miyagi (JP); Shota Kaneko, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/039,446

(22) Filed: Jul. 19, 2018

(65) Prior Publication Data
US 2020/0027688 A1 Jan. 23, 2020

(51) Int. Cl.
*H01J 37/06* (2006.01)
*H01J 3/02* (2006.01)
*H01J 37/32* (2006.01)

(52) U.S. Cl.
CPC ............. *H01J 37/06* (2013.01); *H01J 3/02* (2013.01); *H01J 37/32449* (2013.01); *H01J 37/32532* (2013.01); *H01J 2237/3174* (2013.01); *H01J 2237/334* (2013.01)

(58) Field of Classification Search
CPC ...... H01J 37/06; H01J 37/02; H01J 37/32449; H01J 37/32532; H01J 2237/3174; H01J 2237/334
USPC ... 250/492.1, 492.2, 492.21, 492.22, 492.23, 250/492.3
See application file for complete search history.

(56) References Cited

U.S. PATENT DOCUMENTS

| | | | |
|---|---|---|---|
| 2013/0098551 A1* | 4/2013 | Dorf | H01J 37/32082 156/345.4 |
| 2014/0339980 A1 | 11/2014 | Wu et al. | |
| 2017/0125217 A1 | 5/2017 | Dorf et al. | |
| 2017/0338080 A1* | 11/2017 | Saleh | H01J 37/3233 |

FOREIGN PATENT DOCUMENTS

| | | |
|---|---|---|
| JP | H7-21970 | 1/1995 |
| JP | H7-272659 | 10/1995 |

* cited by examiner

*Primary Examiner* — Nicole M Ippolito
(74) *Attorney, Agent, or Firm* — IPUSA, PLLC

(57) ABSTRACT

A substrate processing apparatus includes a chamber, a pedestal provided in the chamber and having a substrate holding region to hold a substrate thereon, and a gas supply part to supply a gas into the chamber. A plurality of electron gun arrays two-dimensionally arranged so as to cover the substrate holding region is provided and configured to emit electrons toward the gas to cause interactions between the emitted electrons and the gas. A plurality of electron energy control parts is correspondingly provided at each of the electron gun arrays and configured to control energy of the electrons emitted from each of the electron gun arrays independently of each other.

19 Claims, 15 Drawing Sheets

FIG.13
FIG.14
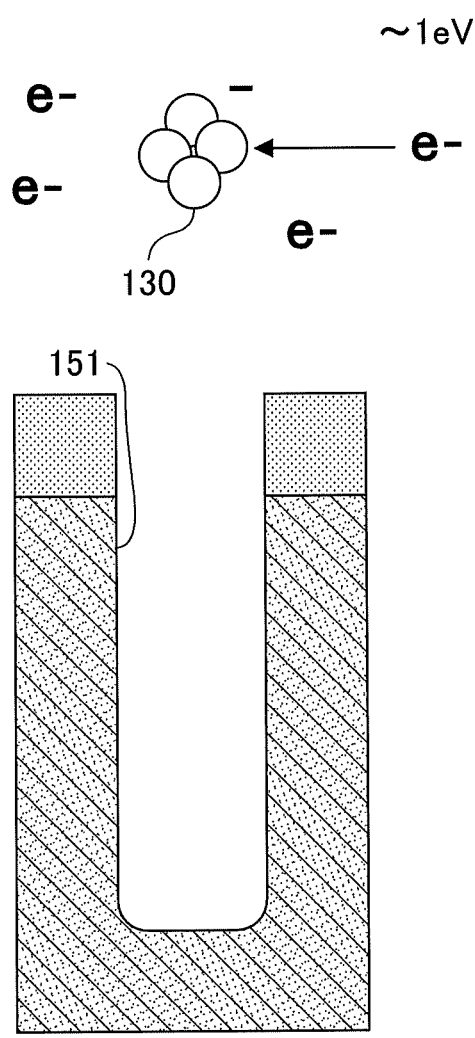
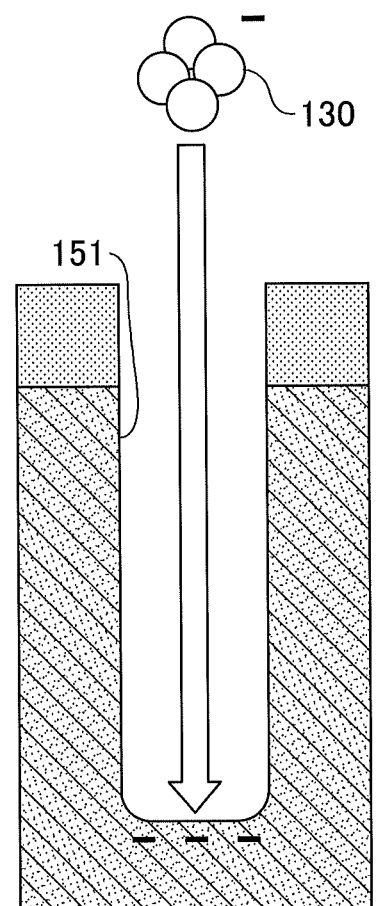

SUBSTRATE PROCESSING APPARATUS

BACKGROUND

1. Technical Field

The disclosure relates to a substrate processing apparatus.

2. Description of the Related Art

The disclosure provides a substrate processing apparatus.

SUMMARY

A substrate processing apparatus includes a chamber, a pedestal provided in the chamber and having a substrate holding region to hold a substrate thereon, and a gas supply part to supply a gas into the chamber. A plurality of electron gun arrays two-dimensionally arranged so as to cover the substrate holding region in a planar view is provided and configured to emit electrons toward the gas to cause interactions between the emitted electrons and the gas. A plurality of electron energy control parts is correspondingly provided at each of the electron gun arrays and configured to control energy of the electrons emitted from each of the electron gun arrays independently of each other.

Additional objects and advantages of the embodiments are set forth in part in the description which follows, and in part will become obvious from the description, or may be learned by practice of the invention. The objects and advantages of the invention will be realized and attained by means of the elements and combinations particularly pointed out in the appended claims. It is to be understood that both the foregoing general description and the following detailed description are exemplary and explanatory and are not restrictive of the invention as claimed.

BRIEF DESCRIPTION OF THE DRAWINGS

FIG. 13 illustrates a process of creating a negative ion;

FIG. 14 illustrates a process of accelerating a negative ion toward a bottom of the recess;

DETAILED DESCRIPTION OF THE EMBODIMENTS

Embodiments of the present disclosure are described below with reference to the accompanying drawings.

Figure 1:
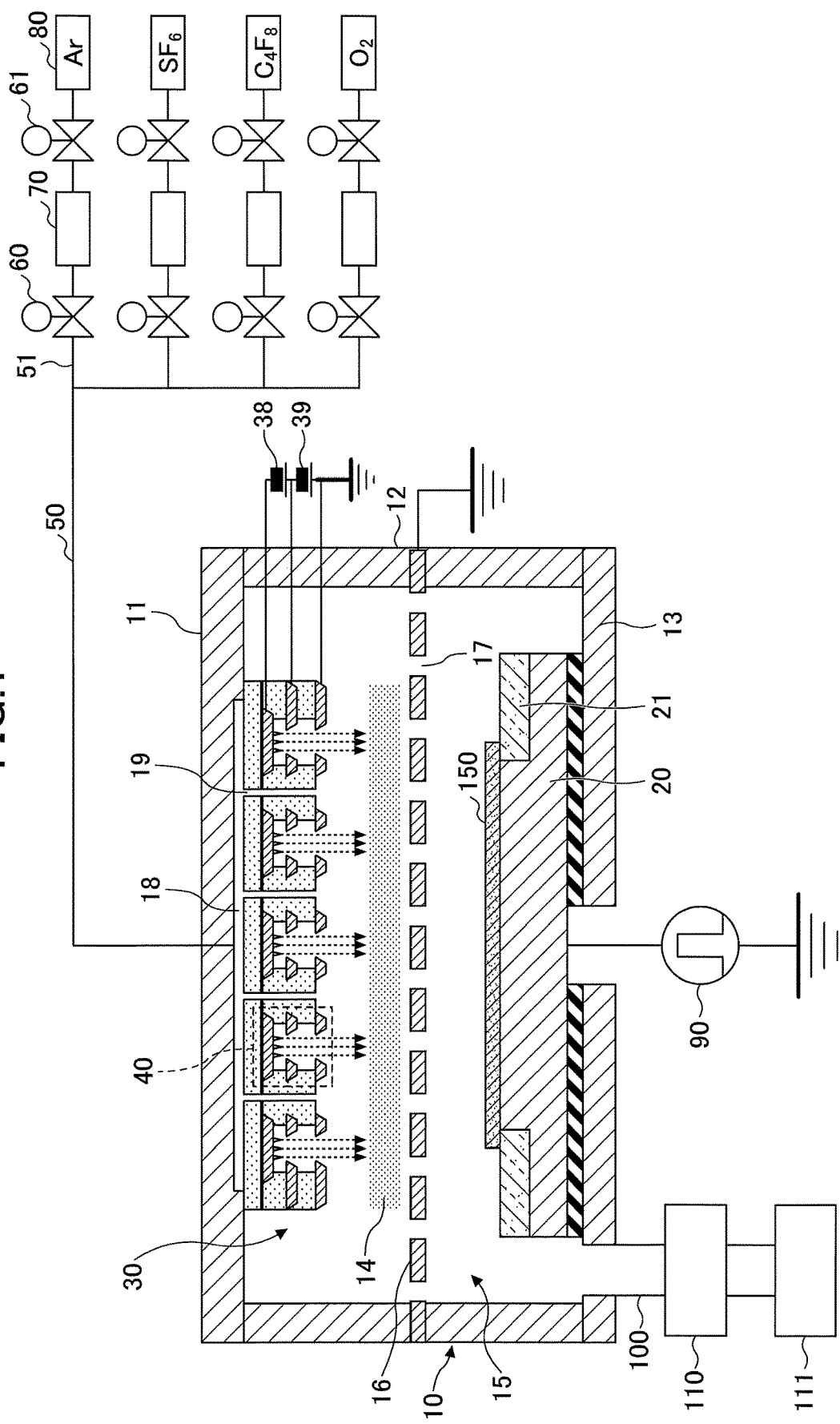
FIG. 1 illustrates a substrate processing apparatus according to an embodiment.

FIG. 1 illustrates a substrate processing apparatus according to an embodiment. The substrate processing apparatus of the present disclosure can be applied to a variety type of substrate processing apparatuses. In the embodiment, an example of applying the substrate processing apparatus of the present disclosure to an etching apparatus is described below.

The substrate processing apparatus includes a chamber 10, a pedestal 20, an electron gun array 30, a gas introduction part 50, valves 61 through 68, mass flow controllers 71 through 74, gas supply sources 81 through 84, a pulse power source 90, vacuum pumps 110 and 111, and a controller 120. A substrate 150 is placed on an upper surface of the pedestal 20.

The chamber 10 is provided to contain the substrate 150 and to process the substrate 150 therein. The chamber 10 has a top plate 11, a side wall 12 and a bottom plate 13. Although the chamber 10 may be made of an appropriate material depending on the intended use, the chamber 10 may be made of anodized aluminum (alumite), for example.

The chamber 10 includes an upper buffer space 18 above the electron gun array 30 as part of the chamber 10. The inner wall of the top plate 11 has a recessed portion in a central portion so as to be thinner than the periphery of the top plate 11. The thinner portion forms the buffer space 18 between the lower surface of the top plate 11 and the electron gun array 30. The gas introduction part 50 penetrates through the top plate 11 and is in communication with the buffer space 18, and introduces a gas to the buffer space 18. A plurality of gas ejection holes 19 are provided between adjacent electron gun arrays 30. The gas supplied into the gas buffer space 18 flows through the gas ejection holes 19 and goes downward.

The chamber 10 includes an intermediate electrode 16 that horizontally extends in the middle of the chamber 10 in a height direction. The intermediate electrode 16 partitions the inside of the chamber 10 into a gas excitation section 14 and a processing section 15. The gas excitation section 14 is provided in an upper portion of the chamber 10, whereas the processing section 15 is provided in a lower portion of the chamber 10. The intermediate electrode 16 has a plurality of openings 17. The openings 17 are provided and distributed in the intermediate electrode 16. An excited gas is supplied from the gas excitation section 14 to the processing section 15 through the openings 17 of the intermediate electrode 16.

The gas excitation section 14 is provided to excite a gas supplied into the gas excitation section 14 from the gas introduction part 50. The gas excitation section 14 contains the electron gun array 30. The electron gun array 30 is provided on the top wall of the chamber 10 (i.e., the inside of the top plate 11) to face the upper surface of the pedestal 20, for example.

The electron gun array 30 includes a plurality of electron guns 40, a current control part 38, and an electron energy control part 39. Each of the plurality of electron guns 40 emits electrons toward the gas excitation section 14 such that the emitted electrons collide with the gas (molecules) introduced into the gas excitation section 14 and diffusing through the gas excitation section 14. The emitted electrons have a predetermined energy controlled by the electron energy control part 39, and change the gas molecules to a predetermined state. Because the gas molecules vary to the predetermined state depending on the energy of the electrons, the gas molecule state can be controlled by controlling the energy of the electrons. The principle will be described later in detail.

As described above, the gas introduction part 50 is provided to supply the gas for processing the substrate 150 into the chamber 10. The gas introduction part 50 is made of, for example, a pipe that penetrates through the top plate 11 of the chamber 10. The gas introduction part 50 is connected to gas pipes 51 that supply a variety of gases to the chamber 10. Each gas pipe 51 is connected to a gas supply source 80 via valves 60 and 61 and a mass flow controller 70. Each gas source 80 contains a gas depending on a process such as Ar, $SF_6$, $C_4F_8$, and $O_2$, as illustrated in FIG. 1. The mass flow controllers 70 are provided to control flow rates of gases supplied from the gas supply sources 80. When a gas is supplied into the chamber 10, the valves 60 and 61 are opened and the mass flow controller 70 controls the flow rate of the gas supplied from the gas supply source 80.

The intermediate electrode 16 may be provided as necessary. The intermediate electrode 16 is, for example, provided between the gas excitation section 14 and the processing section 15. For example, the intermediate electrode 16 prevents the electrons in the gas excitation section 14 from entering the processing section 15. The intermediate electrode 16 is made of a conductive material such as metal including Cr, TiN and TaN. As illustrated in FIG. 1, the intermediate electrode 16 is, for example, grounded to prevent the electrons in the excitation section 14 from entering the processing section 15. Moreover, the intermediate electrode 16 may be connected to a pulse power source instead of being grounded. When the pulse power may supply positive pulses and negative pulses alternately to the intermediate electrode 16, ion energy can be adjusted by the positive pulses and the negative pulses supplied to the intermediate electrode 16.

The processing section 15 is provided to process the substrate 150. The substrate 150 is, for example, made of a silicon wafer, but is not limited to the silicon wafer. The substrate 150 may be made of another material such as SiC depending on the intended use. In the embodiment, the etching apparatus etches the substrate 150 or a film deposited on the substrate 150. The processing section 15 includes the pedestal 20 to support the substrate 150 placed thereon.

The pedestal 20 holds the substrate 150 to be processed on its upper surface. The pedestal 20 is provided so as to face the electron gun array 30 to process the substrate 150 held thereon with the excited gas. The pedestal 20 is, for example, formed as an electrostatic chuck to hold the substrate 150 thereon. Also, the pedestal 20 may include a focus ring 21 at the periphery of the upper surface. The focus ring 21 is provided to process the substrate uniformly. The focus ring 21 is made of, for example, silicon, quartz and the like.

A pulse power source 90 is provided to apply a bias voltage to the pedestal 20. The pulse power source 90, for example, outputs positive pulse power and negative pulse power. Thus, the pulse power source 90 applies positive voltages and negative voltages to the pedestal 20 as the bias voltage. The pulse power source 90 can change voltage value and frequency of the pulse power depending on the intended use.

Here, the electron gun array 30 serves as an upper electrode, and the pedestal serves as a lower electrode. Although the substrate processing apparatus according to the embodiment does not use a random reaction causing a chain reaction for etching, the substrate processing apparatus may be configured to be similar to the etching apparatuses that use randomly generated reaction species, with respect to the basic structure and the structure of the processing section 15.

The vacuum pumps 110 and 111 are provided to evacuate the chamber 10 and are connected to the chamber 10 via an exhaust pipe 100. The vacuum pump 110 may be a turbo molecular pump, and the vacuum pump 111 may be a dry pump, for example. A variety of vacuum pumps are available for the vacuum pumps 110 and 111 as long as the vacuum pumps 110 and 111 can properly evacuate the chamber 10.

The controller 120 controls operation of the substrate processing apparatus. The controller 120 controls the whole operation of the substrate processing apparatus in accordance with a process recipe, and also controls the operation and setting of the electron gun array 30.

The controller 120 may be constituted of a microcomputer that includes a CPU (Central Processing Unit) and a memory such as a ROM (Read Only Memory) and a RAM (Random Access Memory). The controller 120 reads a program that contains instructions and may implement a substrate processing process. For example, a recipe that stores program instructions to perform a substrate process is set in a predetermined reading device, and the reading device installs the program into the memory of the microcomputer. The CPU reads the program in executes the instructions in accordance with the recipe. When executing the program, the controller 120 controls the whole operation of the substrate processing apparatus including the operation of the electron gun array 30.

Figure 2:
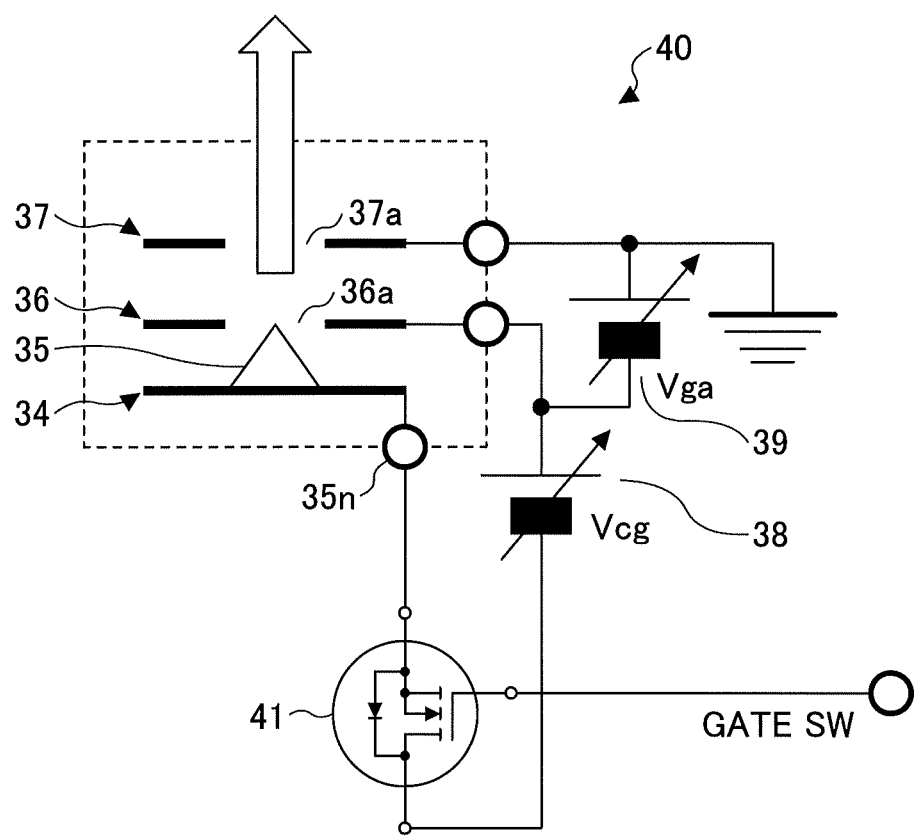
FIG. 2 illustrates a single electron gun contained in the electron gun array.

FIG. 2 illustrates a single electron gun 40 contained in the electron gun array 30.

The electron gun 40 includes a cathode conductive pattern 34, a cathode 35, a gate electrode 36, an acceleration electrode 37, the current control part 38, and the electron energy control part 39, and a switching device 41.

The cathode 35 is provided to emit electrons from the tip. Although the configuration of the cathode 35 is not limited to a specific shape, the cathode 35 may have a sharp edge or tip to readily emit electrons. FIG. 2 illustrates the cathode 35 as a Spindt-type field emitter, but any type of cathode can be used for the cathode 35. Although FIG. 2 illustrates the single cathode 35, the single electron gun array 30 includes a plurality of cathodes 35, as illustrated in FIG. 1. The plurality of cathodes 35 are connected to a single node 35n (which may be also referred to as a "connection point"), as illustrated in FIG. 2. However, in FIG. 2, the single electron gun 40 is described for the purpose of illustration.

The gate electrode 36 is provided to form an electric field that causes electrons to emit from the tip of the cathode 35. The gate electrode 36 has an opening 36a that surrounds the cathode 35. More specifically, the gate electrode 36 is provided as high as the tip of the cathode 35 to causes the cathode 35 to emit electrons from the tip.

The current control part 38 includes, for example, a variable direct-current power source. The negative terminal of the current control part 38 is electrically connected to the cathode 35 via the transistor 41 and the cathode conductive pattern 34. The positive terminal of the current control part 38 is electrically connected to the gate electrode 36. An electric field between the cathode 35 and the gate electrode 36 determines whether electrons are emitted or not from the cathode 35. When the minimum value of the electric field where electrons can be emitted from the cathode 35 is set at 1 V/μm, and if the distance between the tip of the cathode 35 and the gate electrode is set at 0.1 μm, the electrons are emitted from the tip of the cathode 35 when a voltage of 0.1 V is applied between the cathode 35 and the gate electrode 36. Thus, as the distance between the tip of the cathode 35 and the gate electrode 36 is set narrower, the electrons can be emitted from the cathode 35 at a lower voltage. Hence, the distance between the tip of the cathode 35 and the gate electrode 36 is set as short as possible to draw the electrons from the cathode 35 with the energy as low as possible because a control range of the electron energy performed by applying a voltage between the gate electrode 36 and the acceleration electrode 37 can be broaden to obtain desired electron energy. For example, the voltage applied to the cathode 35 and the gate electrode 36 may be in a rage of 0.05 to 2 V, in a range of 0.07 to 1.5 V, more in a range of 0.1 to 1.0 V.

Figure 3:
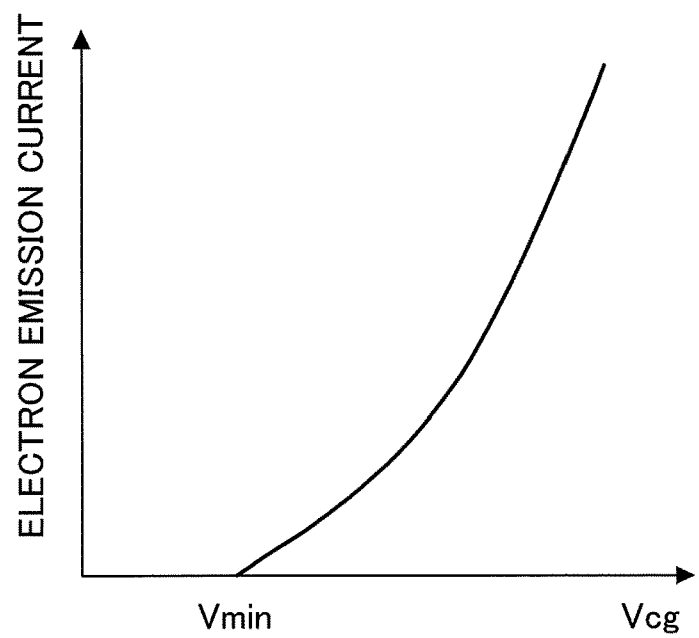
FIG. 3 illustrates a relationship between the voltage between the cathode and the gate electrode (Vcg) and an electron emission current.

FIG. 3 illustrates a relationship between the voltage applied between the cathode 35 and the gate electrode (Vcg), and an electron emission current. The electron emission current indicates a current that flows from the cathode 35 to the negative terminal of the current control part 38. When the electrons are emitted from the cathode 35, the current emission current becomes more than zero. A "Vmin" in FIG. 3 indicates the minimum voltage value where the electrons can be emitted from the cathode 35. As illustrated in FIG. 3, because the relationship between the Vcg and the electron emission current is not proportional to each other, the Vcg is, for example, set at a value that is slightly higher than the Vmin.

The value of electric field that can cause the cathode 35 to emit electrons depends on a work function of the material of the cathode 35. The material of the cathode is, for example, made of a high melting-point metal such as tungsten (W), carbon nanotube, or molybdenum (Mo). However, the material of the cathode 35 is not limited to the above materials, and any appropriate material can be used for the cathode 35.

On the other hand, the gate electrode 36 and the acceleration electrode 37 may be made of chrome (Cr), titanium nitride (TiN), tantalum nitride (TaN), for example. As long as the gate electrode 36 and the acceleration electrode 37 are formed thin and hard, and have resistance characteristics to the process gas (e.g., fluorine-containing gas), a variety of materials are available for the gate electrode 36 and the acceleration electrode 37.

Under the setting of the distance between the tip of the cathode 35 and the gate electrode 36 that determines the minimum voltage to emit the electrons from the cathode 35, the current control part 38 can control whether to emit the electrons from the cathode 35 by controlling the voltage applied between the cathode 35 and the gate electrode 36. Here, the electron emission current for each electron gun array 30, which is regarded as a single pixel, can be measured by inserting an ammeter between the node 35*n* to which the plurality of cathodes are connected in parallel and the switching device 41 or inserting a resistor and measuring the voltage of both ends of the inserted resistor. Thus, each pixel, which is the single electron gun array 30, can be controlled based on the electron emission current measured for each pixel. Moreover, the switching device 41 is provided to turn on and off the output of the electrons so as to make a pulse wave. In the embodiment, although the switching device 41 is constituted of a MOS (Metal Oxide Semiconductor) transistor, any switching device can be used as the switching device 41.

The acceleration electrode 37 is provided to accelerate the electrons emitted from the cathode 35. The acceleration electrode 37 has an opening 37*a* that matches the opening 36*a*. As long as the center of the opening 37*a* coincides with the center of the opening 36*a*, the acceleration electrode 37 may have a variety of shapes. However, to uniformly accelerate electrons at each electron gun 40, the acceleration electrode 37, for example, has the same shape as the shape of the gate electrode 36. FIG. 2 illustrates the acceleration electrode 37 having the same shape as the shape of the gate electrode 36.

The electron energy control part 39 is constituted of, for example, a variable direct-current power source that has a positive terminal and a negative terminal. The negative terminal of the electron energy control part 39 is connected to the gate electrode 36, whereas the positive terminal of the electron energy control part 39 is connected to the acceleration electrode 37. In the embodiment illustrated in FIG. 2, the positive terminal of the electron energy control part 39 is grounded. Thus, the potential of the acceleration electrode 37 is set at the ground potential (zero), and the potential of the gate electrode 36 is set at a negative potential. The initial energy of the electrons emitted from the cathode 35 and the voltage applied between the gate electrode 36 and the acceleration electrode 37 (Vga) determines the electron energy emitted from the electron gun 40.

Figure 4:
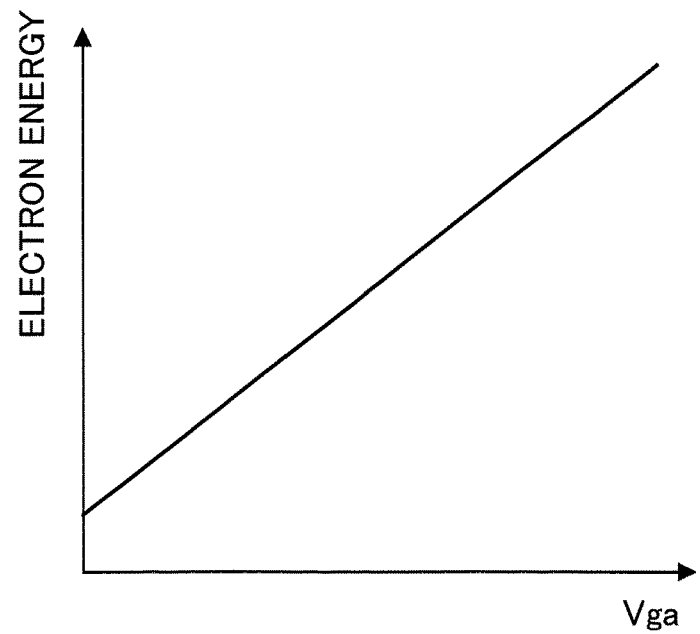
FIG. 4 illustrates a relationship between the voltage applied between the gate electrode 36 and the acceleration electrode 37 (Vga) and the electron energy.

FIG. 4 illustrates a relationship between the voltage applied between the gate electrode 36 and the acceleration electrode 37 (Vga) and the electron energy. As illustrated in FIG. 4, the electron energy is proportional to the Vga. Hence, by controlling the Vga (changing the Vga), the electron energy can be readily controlled and can be readily set at a desired value because it changes linearly.

In the embodiment, the current control part 38 and the electron energy control part 39 can be controlled independently of each other. Thus, the current control part 38 can generate the electrons with desired initial energy, and the electron energy control part 39 can control the electron energy emitted from the electron gun 40 and going to the gas.

Figure 5:
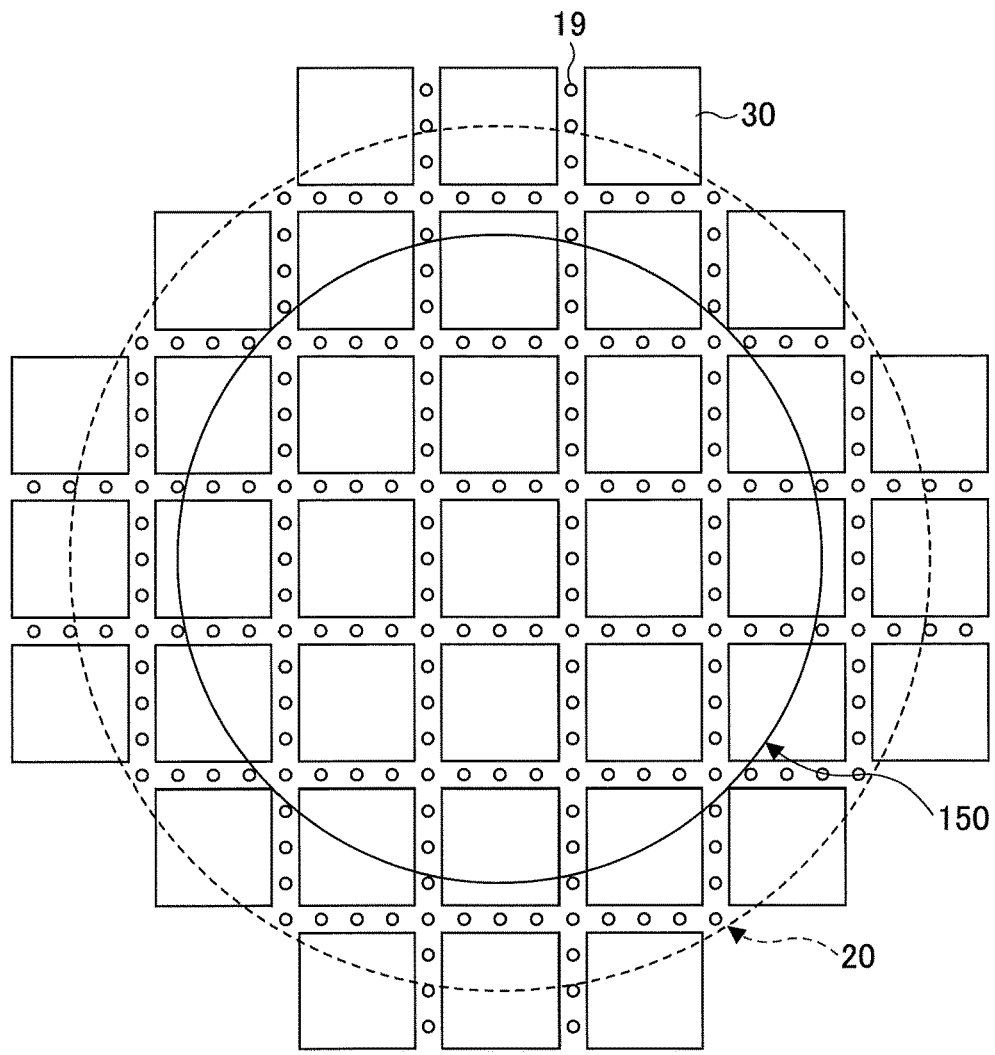
FIG. 5 illustrates a planar view of electron gun arrays.

FIG. 5 illustrates a planar view of electron gun arrays 30. A plurality of electron gun arrays 30 is two-dimensionally arranged to entirely cover an area of the substrate 150. Thus, the plurality of electron gun arrays 30 is arranged in a matrix form on the top wall of the chamber 10 to cover the whole area of the substrate 150 placed on the pedestal 20. Each of the electron gun arrays 30 can control energy of electrons emitted therefrom. Hence, the electron gun arrays 30 can locally control the electron energy across the surface of the substrate 150.

Moreover, the electron gun arrays 30 have gas ejection holes 19 in narrow crossing spaces between the adjacent electron gun arrays 30. By providing the gas ejection holes 19 between the adjacent electron gun arrays 30, the gas can be introduced uniformly in a gas excitation section 14.

Thus, the gas can be uniformly supplied from the entire area of the electron gun arrays 30 as a showerhead supplies a gas, and the supplied gas is uniformly excited by electrons emitted from the electron gun arrays 30 when the electron gun arrays 30 can emit the electrons with uniform energy.

In contrast, the gas introduction part 50 may be provided through the side wall 12 of the chamber 10. By providing a plurality of gas introduction parts 50 that penetrate through the side wall 12 of the chamber 10 apart from each other in the circumferential direction and between the electron gun arrays 30 and the intermediate electrode 16 in the height direction, the gas may be supplied into the buffer space 18

Figure 6:
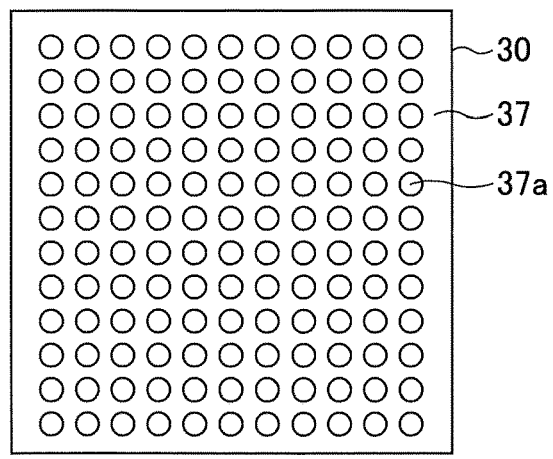
FIG. 6 illustrates a planar view of a single electron gun array.

FIG. 6 illustrates a planar view of a single electron gun array 30. The acceleration electrode 37 forms the top plate of the electron gun array 30. The acceleration electrode 37 has many openings 37a, each of which has the cathode 35 and the openings 36a of the gate electrode 36. In other words, the acceleration electrode 37 and the gate electrode 36 are formed as a single metal plate that has many openings 37a and 36a arranged in a matrix form. Thus, the single electron gun array 30 includes the plurality of electron guns 40 that is described in FIG. 2.

The electron gun array 30 may be formed into a square shape, for example. When the substrate 150 is formed into a circular shape, the electron gun arrays 30 having the square shapes can cover the whole area of the substrate 150 by being arranged in a matrix form. Although the size of the electron gun array 30 may be determined depending on the size of the substrate 150 and the intended use, the side of the electron gun array 30 may be in a range from 1 cm to 5 cm, for example, at 2 cm as an example, when the substrate 150 has a diameter of 300 mm. Although FIG. 5 schematically illustrates each of the electron gun arrays 30 relatively large, each of the electron gun arrays 30 may be formed smaller than the illustration of FIG. 5. Also, the number of the electron guns 40 contained in the single electron gun array 30 is preferably set as many as possible. For example, the diameter of the openings 37a of the acceleration electrode 37 may be set at 100 nm.

Figure 7:
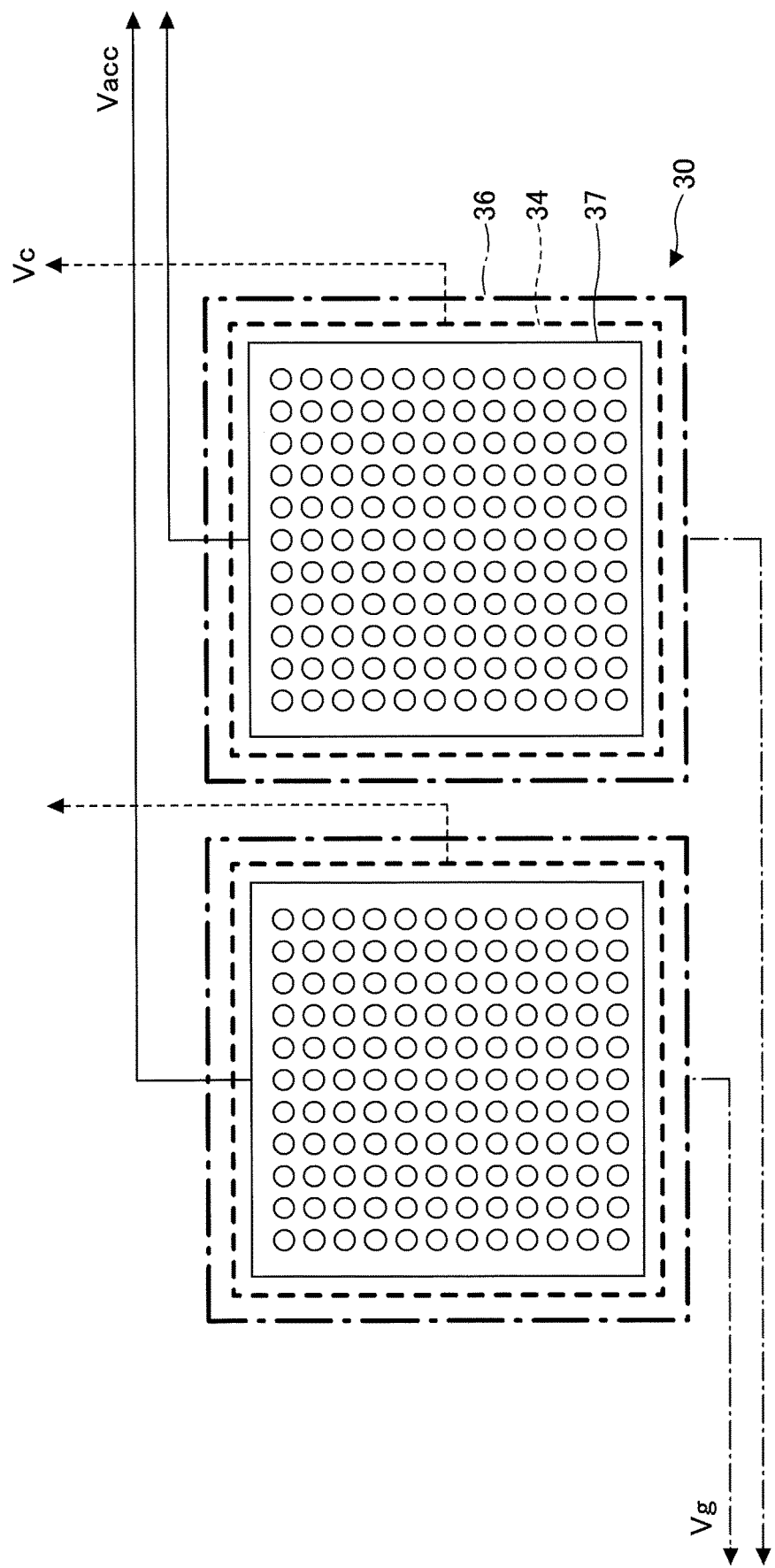
FIG. 7 illustrates two adjacent electron gun arrays.

FIG. 7 illustrates two adjacent electron gun arrays 30. Each of the electron gun arrays 30 has a cathode conductive pattern 34 connected to a Vc line, a gate electrode 36 connected to a Vg line, and a accelerate electrode 37 connected to a Vacc line separately from each other. Thus, each of the electron gun arrays 30 can be separately controlled with respect to the voltage between the cathode 35 (i.e., cathode conductive pattern 34) and the gate electrode 36, and the voltage between the gate electrode 36 and the acceleration electrode 37 because the voltage lines Vc, Vg and Vacc corresponding to the respective electron gun arrays 30 are provided separately from each other. Thus, although the electron guns 40 contained in the electron gun array 30 cannot be controlled separately from each other, each of the electron gun arrays 30 can be controlled independently of each other.

Figure 8:
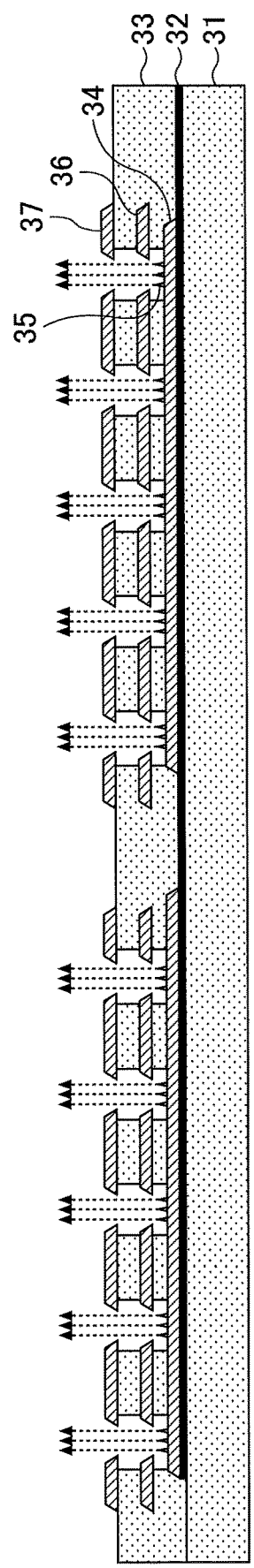
FIG. 8 illustrates a cross-sectional view of two adjacent electron gun arrays.

FIG. 8 illustrates a cross-sectional view of two adjacent electron gun arrays 30. As illustrated in FIG. 8, the electron gun arrays 30 include a base plate 31, an adhesive layer 32, an upper plate 33, cathode conductive patterns 34, cathodes 35, gate electrodes 36 and acceleration electrodes 37. Here, each of the base plate 31, the adhesive layer 32 and the upper plate 33 is formed as a single piece through the two electron gun arrays 30. In contrast, two of the cathode conductive patterns 34, the cathode electrodes 35, the gate electrodes 36 and the acceleration electrodes 37 are each provided corresponding to the two electron gun arrays 30 on a one-to-one basis. Thus, the electron gun arrays 30 are physically formed as one piece to entirely cover the area of the substrate 150, but are formed so that each of the electron gun arrays 30 can control electron energy independently of each other, thereby locally controlling the electron energy and the gas excitation. Hence, even if the characteristics of each of the electron gun arrays 30 differently vary over time from each other, the uniform gas excitation can be achieved by controlling the electron energy such that each of the electron gun arrays 30 emits electrons with the same energy.

Figure 9:
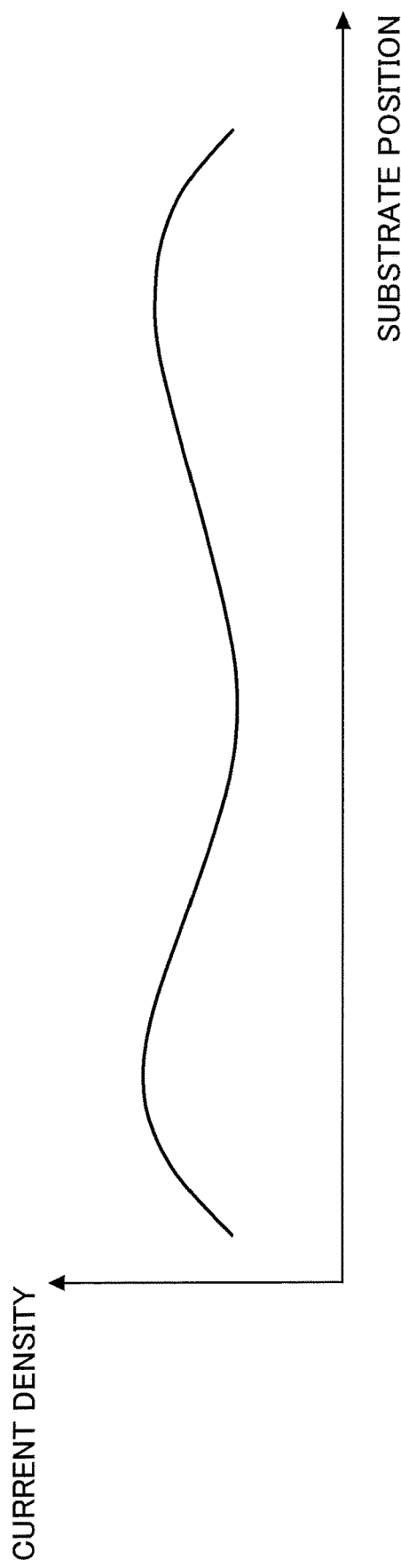
FIG. 9 illustrates an example of a distribution of current density.

FIG. 9 illustrates an example of a distribution of current density. As illustrated in FIG. 9, the current density may vary over time differently at positions of the electron gun arrays 30. Because parts of the electron gun arrays 30 have different characteristics and tolerances, the variation can occur.

Figure 10:
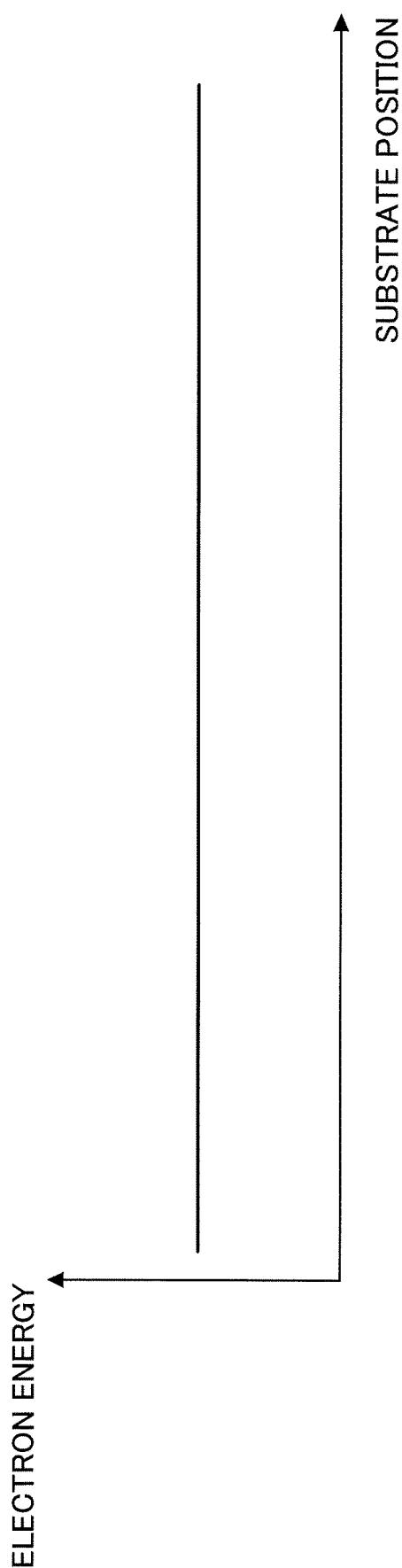
FIG. 10 illustrates an example of a distribution of electron energy.

FIG. 10 illustrates an example of a distribution of electron energy. As illustrated in FIG. 10, even if the current density varies at positions, the electron gun arrays 30 according to the embodiment can output electrons with uniform electron energy by locally adjusting the electron energy of the electron gun arrays 30 because the current control and the electron energy control can be performed independently of each other. For example, when some electron gun arrays 30 deteriorate, the current control parts 38 are adjusted to supply uniform current. Even if the current control parts 38 are adjusted, acceleration voltage controlled by the acceleration control parts 39 can be kept constant to keep the electron energy constant because the electron energy and the electron emission current can be controlled independently of each other.

Thus, the electron gun arrays 30 according to the embodiment can achieve the uniform electron energy across the surface of the substrate 150 even if each of the electron gun arrays 30 has different I-V characteristics from each other.

Figure 11:
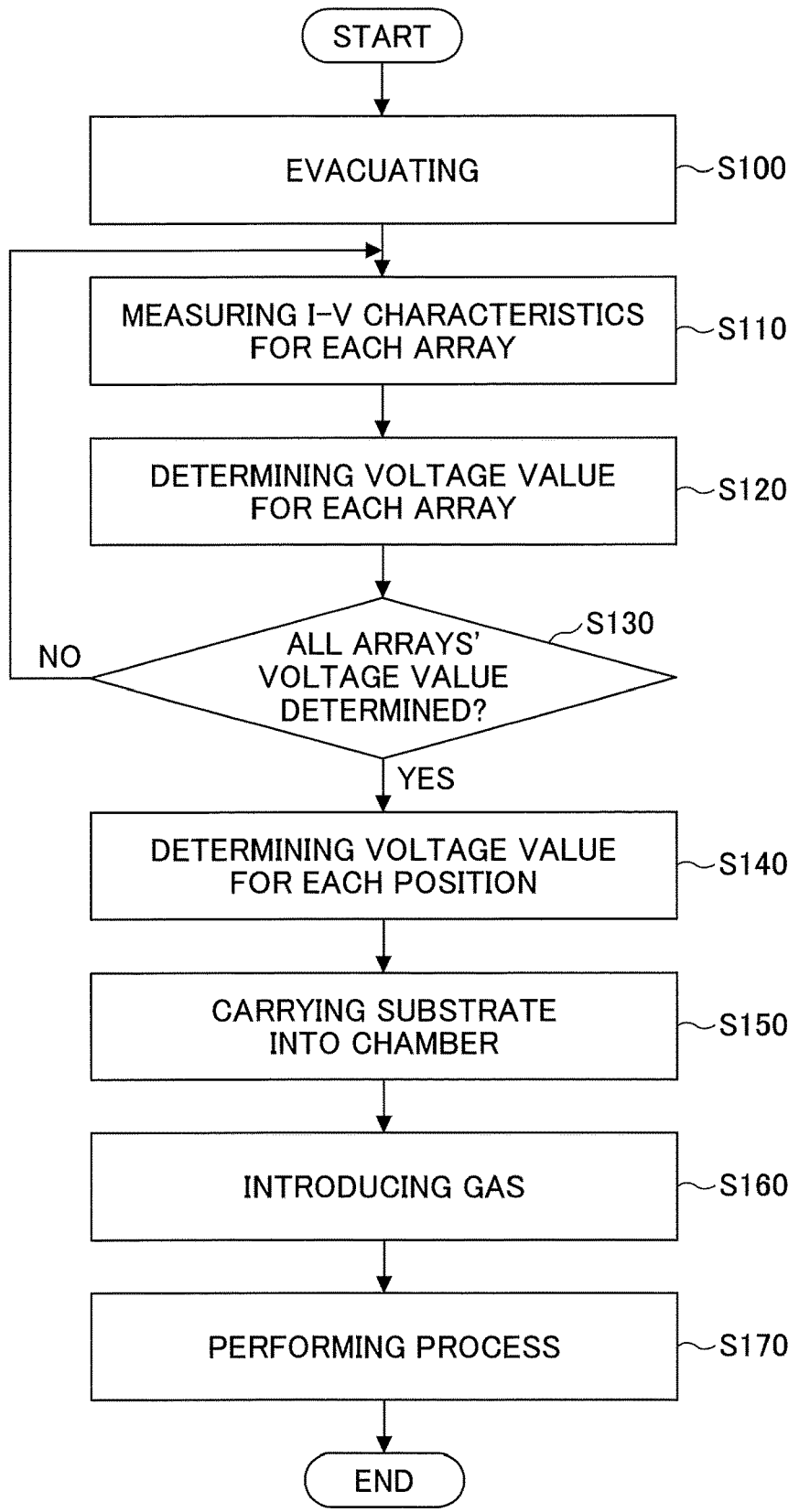
FIG. 11 illustrates an example of a process flow sequence performed by a substrate processing apparatus according to an embodiment of the present disclosure.

FIG. 11 illustrates an example of a process flow sequence performed by a substrate processing apparatus according to an embodiment of the present disclosure.

In step S100, the controller 120 causes the vacuum pumps 110 and 111 to evacuate the chamber 10. When the pressure in the chamber 10 reaches a predetermined degree of vacuum that the electrons collide with the gas molecules only one time, the process advances to step S110.

In step S110, I-V characteristics are measured for each electron gun array 30. As discussed with reference to FIGS. 2 and 3, the I-V characteristics of each electron gun 40 can be measured by measuring a current flowing from the cathode 35 to the node 35n for the set voltage of the current control part 38 (Vcg). Moreover, the I-V characteristics of each electron gun array 30 can be measured by measuring a current flowing from the node 35n of the cathodes 35 to the negative terminal of the current control part 38. The I-V characteristics are measured to understand the conditions of each of the electron gun arrays 30 because each of the electron gun arrays 30 may have different I-V characteristics, and because the I-V characteristics may change over time even in the same electron gun array 30. Thus, the I-V characteristics are measured for each of the electron gun arrays 30. When the I-V characteristics of each of the electron gun arrays 30 are measured, a current value flowing from the node 35n of the cathodes 35 to the current control part 38 is measured, while the output voltage of the current control part 38 is used as the measured voltage value.

When performing step S110, the controller 120 controls the voltage of the current control part 38 (variable direct current power source) and causes a current measurement provided between the node 35n and the negative terminal of the current control part 38 to measure the current flowing from the node 35n to the negative terminal of the current control part 38.

In step S120, a voltage value (Vcg) between the cathode node 35n and the gate electrode 36 for each of the electron gun arrays 30 is determined. The controller 120 may determine the voltage value (Vcg) of each of the electron gun arrays 30. When the voltage value (Vcg) is determined, the current value becomes the reference value. On this occasion, the controller 120 controls the voltage value (Vcg) of each of the electron gun arrays 30 so that the current values of all of the electron gun arrays 30, which are regarded as pixels, become a target current value (constant value). Thus, the controller 120 determines the voltage value (Vcg) between the cathode node 35n and the gate electrode 36 based on the current value that flows from the cathode node 35n to the negative terminal of the current control part 38 for each pixel (i.e., each electron gun array 30). When the controller 120 determines the voltage value between the cathode node 35n and the gate electrode 36 (Vcg) based on the current value, the controller 120 sets the voltage value of the current control part 38 to the determined voltage value.

In step S130, the controller 120 determines whether voltages of all of the electron gun arrays 30 are determined. In one example, the controller 120 sets the voltage value (Vcg) such that all of the electron gun arrays 30 have the same voltage value. In another example, the controller 120 sets the current value such that each of the electron gun arrays 30 has different current values. The current value of each of the pixels may be set uneven purposefully to equalize the distribution of reaction species. When the voltage values between the cathodes 35 and the gate electrodes 36 (Vcg) of all of the electron gun arrays 30 are not yet determined, the controller 120 goes back to step S110 and repeats steps S110 and S120 until finishing determining the voltage values of all of the electron gun arrays 30. When the controller 120 determines that the voltage values (Vcg) of all of the electron gun arrays 30 and sets the output voltage of the current control part 38 to the determined value, the process goes to step S140.

In step S140, the controller 120 determines the voltage value between the acceleration electrode 37 and the gate electrode 36 (Vga) for each of the electron gun arrays 30. For example, the controller 120 adjusts each of the voltage values (Vga) so as to emit electrons having uniform energy. In step S120, the controller 120 sets the voltage values between the cathode nodes 35n and the gate electrodes 36 variously depending on the conditions of each of the electron gun arrays 30. Hence, the voltage values (Vcg) of the electron gun arrays 30 may differ from each other. When electron energy emitted from the electron gun arrays 30 are desired to be set uniform, because the electron energy depends on the acceleration voltage between the cathodes 35 (which is equal to the voltage of the cathode node 35) and the acceleration electrode 37, the voltage values (Vga) between the gate electrodes 36 and the acceleration electrodes 37 are adjusted so as to equalize the acceleration voltage. Thus, even if the voltage values (Vcg) between the cathodes 35 and the gate electrode 36 differ from each other among all of the electron gun arrays 30, the acceleration voltages of each of the electron gun arrays 30 can be made uniform by adjusting each of the voltage values (Vga) between the gate electrode node 35n and the gate electrode 36 for each of the electron gun arrays 30 separately from each other so as to equalize each of the acceleration voltages between the cathode node 35n and the acceleration electrode 37. Hence, by setting the voltage values (Vga) between the gate electrode 36 and the acceleration electrode 37 to an appropriate value depending on the voltage values (Vcg) between the cathode nodes 35n and the gate electrodes 36 set for the electron gun arrays 30, electron energy emitted from the electron gun arrays 30 can be made uniform. Accordingly, to obtain substantially the same kind of reaction species of the gas, the controller 120 sets the voltages between the gate electrodes 36 and the acceleration electrodes 37 (Vga) of all of the electron gun arrays 30 to a constant value.

In contrast, a specific region of the substrate 150 needs to be processed more intense or less intense than the other region, a specific electron gun array 30 used to process the specific region may be controlled to cause the electrons emitted to the specific region to have higher energy or lower energy.

Thus, according to the substrate processing apparatus according to the embodiment, the energy of the electrons emitted to the gas may be regionally controlled to process the substrate 150 in accordance with the desired process and the intended use.

In step S150, a transfer arm (not illustrated in the drawings) carries a substrate into the chamber 10. The substrate 150 is placed on the pedestal 20. Otherwise, the substrate 150 may be carried into the chamber between steps S100 and S110. Although a type of the substrate 150 is not limited to a specific type of substrate, for example, a silicon wafer may be used as the substrate 150.

In step S160, a gas for a process is introduced from the gas introduction part 50 into the chamber 10. Specifically, the controller 120 controls the valves 61 through 68 and the mass flow controller 71 through 74 so that a process gas is supplied to the buffer space 18 of the chamber 10 via the pipe 50 at a predetermined flow rate. The process gas supplied into the buffer space 18 flows through the gas ejection holes 19 to the gas excitation section 14. At this time, the electron gun arrays 30 emit electrons having uniform energy. Thus, molecules contained in the gas convert to reactive species due to the collision with the electrons having the predetermined energy. Here, the process gas changes its state depending on the energy of the electrons colliding with the gas. Hence, the gas conditions can be controlled by controlling the electron energy emitted from the electron gun arrays 30. The gas control will be described below in more detail.

In step S170, the controller 120 performs the process on the substrate 150. When the substrate processing apparatus is formed as an etching apparatus, an etching process is performed on the substrate 150. On the other hand, the substrate processing apparatus is formed as a film deposition apparatus, a film deposition process is performed on the substrate 150. Because the gas converts to the reactive species having substantially the same energy, the reactive species uniformly react with the substrate 150. When the substrate processing apparatus etches a film deposited on the substrate 150, the reactive spaces with substantially the same energy react with the film deposited on the substrate 150. When the substrate processing apparatus is formed as a film deposition apparatus to deposit a film on the substrate 150 by ALD (Atomic Layer Deposition) or CVD (Chemical Vapor Depostion), the reactive species with substantially the same energy react with another gas supplied into the chamber 10. Thus, the uniform process can be performed on the substrate 150 by controlling the energy of the electrons.

When the substrate processing apparatus finishes the process, the process ends.

As discussed above, the substrate processing apparatus can perform a variety of processes depending on the intended use, including the uniform process.

Next, the difference between a conventional random reaction and a direct electron interaction of the embodiment is described below.

Figure 12:
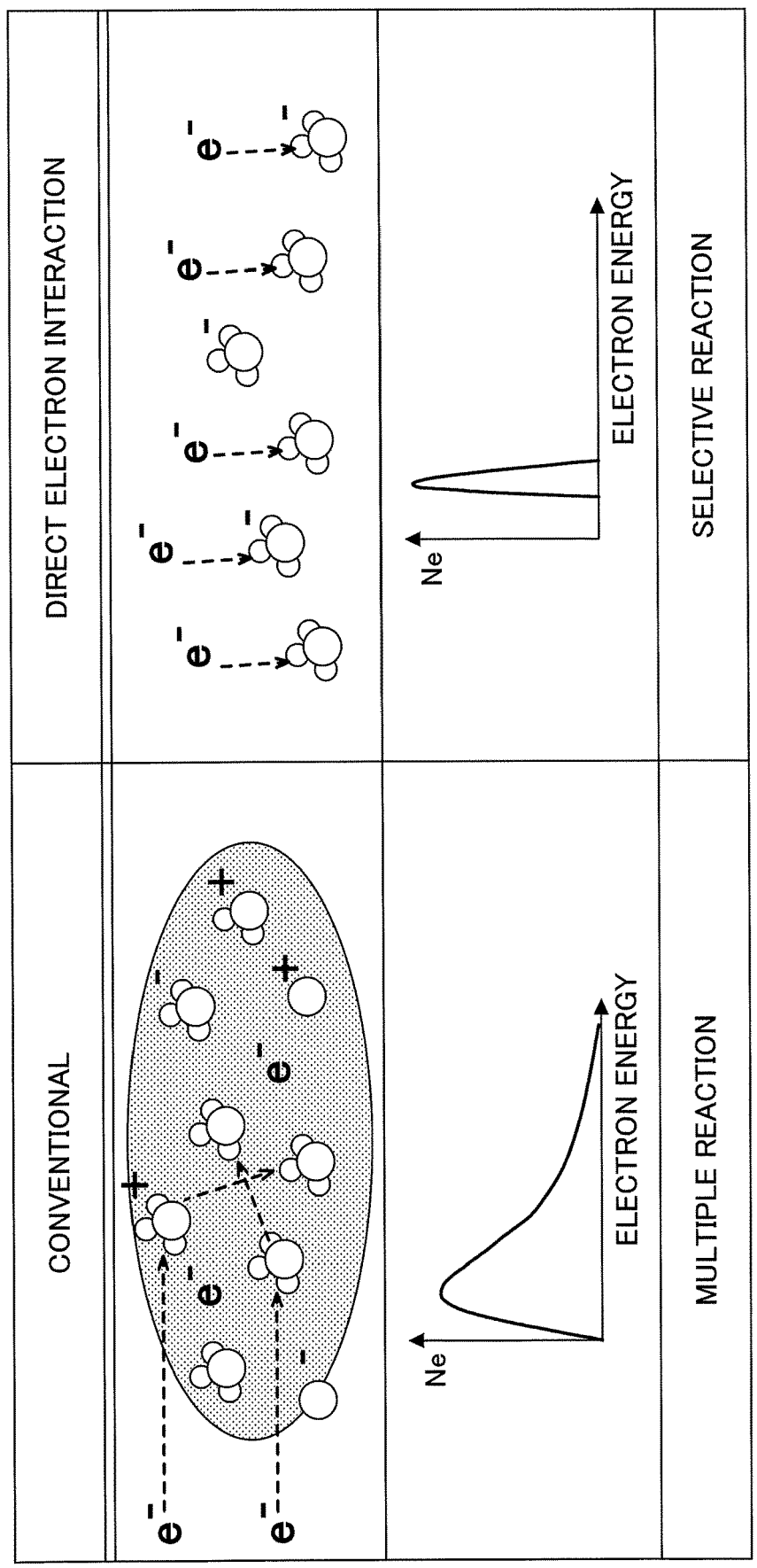
FIG. 12 illustrates the conventional random reaction and the direct electron interaction.

FIG. 12 illustrates the conventional random reaction and the direct electron interaction.

The left column in FIG. 12 illustrates an example of the conventional random reaction. As illustrated in the drawing, in the random reaction, after electrons collide with molecules of a gas, the ionized molecules collide with other molecules one after another. In other words, a chain reaction occurs when the random reaction occurs. In this case, the reaction is difficult to be controlled because the reaction occurs one after another a plurality of times. FIG. 12 illustrates an electron energy distribution at a lower portion of the left column, and the electron energy distribution illustrates a normal distribution curve. Thus, the electron energy distributes in a wide energy range, which means that the electron energy cannot be controlled to a specific value.

In contrast, the right column in FIG. 12 illustrates an example of a direct electron interaction according to the embodiment. As illustrated upper portion of the right column, electrons collide with gas molecules substantially one time. When electron energy is small, the electrons adsorb on or attach to the gas molecules after colliding with the gas molecules. More specifically, because the electron energy is small, the electrons do not bounce off the gas molecules after colliding with the gas molecules but attach to the gas molecules. In other words, electron attachment occurs by controlling the electron energy to a predetermined small energy such that electrons do not cause disscociation of the gas molecules. Thus, dissociation does not occur after the electrons collide with the gas molecules, and negative ions are generated.

The lower portion of the right column in FIG. 12 illustrates an electron energy distribution. As illustrated in the graph, the electrons are in a specific energy range. Thus, the direct electron interaction occurs in a specific narrow energy range, and a selective reaction occurs. Here, the direct election interaction causes the gas to become reactive species or active species. The reactive species or the active species have a specific energy, but are different from reactive species generated by the conventional random reaction. Because the reactive species or the active species do not cause a chain reaction, the energy of the reactive species or the active species can be controlled by the energy of the electrons emitted from the electron gun arrays 30.

Next, an example of creating specific reaction species is described below.

TABLE 1 shows reactions of $CF_4$ and derivative species caused by collision with electrons. In TABLE 1, "Threshold or Coefficient" shows the energy of electrons, and "Reaction" shows types of reaction caused by the collision with the electrons having the energy of "Threshold or Coefficient."

TABLE 1

| Reaction | Threshold or coefficient [eV] |
|---|---|
| Ionization | |
| 1. $CF_4 + e^- \rightarrow CF_3^+ + F + 2e^-$ | 15.9 |
| 2. $CF_3 + e^- \rightarrow CF_3^+ + 2e^-$ | 8.7 |
| 3. $CF_3 + e^- \rightarrow CF_2 + F^+ + 2e^-$ | 20.0 |
| 4. $CF_3 + e^- \rightarrow CF_2^+ + F + 2e^-$ | 16.4 |
| 5. $CF_3 + e^- \rightarrow CF^+ + F_2 + 2e^-$ | 21.4 |
| 6. $CF_2 + e^- \rightarrow CF_2^+ + 2e^-$ | 11.4 |
| 7. $CF_2 + e^- \rightarrow CF + F^+ + 2e^-$ | 22.0 |
| 8. $CF_2 + e^- \rightarrow CF^+ + F + 2e^-$ | 11.7 |
| 9. $CF + e^- \rightarrow CF^+ + 2e^-$ | 9.1 |

TABLE 1-continued

| Reaction | Threshold or coefficient [eV] |
|---|---|
| Electron attachment | |
| 10. $CF_4 + e^- \rightarrow CF_3 + F^-$ | 4.3 |
| 11. $CF_4 + e^- \rightarrow CF_3^- + F$ | 4.3 |
| Dissociation | |
| 12. $CF_4 + e^- \rightarrow CF_3 + F + e^-$ | 10.0 |
| 13. $CF_4 + e^- \rightarrow CF_2 + F_2 + e^-$ | 15.0 |
| 14. $CF_4 + e^- \rightarrow CF + F_2 + F + e^-$ | 20.0 |
| 15. $CF_3 + e^- \rightarrow CF_2 + F + e^-$ | 10.4 |
| 16. $CF_3 + e^- \rightarrow CF + F_2 + e^-$ | 14.9 |
| 17. $CF_2 + e^- \rightarrow CF + F + e^-$ | 11.2 |
| 18. $CF + e^- \rightarrow C + F + e^-$ | 12.0 |
| 19. $CF_3^+ + e^- \rightarrow CF_2^+ + F + e^-$ | 10.4 |
| 20. $CF_2^+ + e^- \rightarrow CF^+ + F + e^-$ | 11.2 |
| 21. $CF^+ + e^- \rightarrow C^+ + F + e^-$ | 12.0 |
| Vibrational excitation of $CF_4$ | |
| 22. $CF_4 + e^- \rightarrow CF_4^* + e^-$ | 4.0 |
| 23. $CF_4 + e^- \rightarrow CF_4^* + e^-$ | 0.159 |
| 24. $CF_4 + e^- \rightarrow CF_4^* + e^-$ | 0.078 |

As TABLE 1 shows, the types of "Reaction" includes "Ionization", "Electron attachment", "Dissociation" and "Vibrational excitation of $CF_4$." In the same type of "Reaction", the values of "Threshold or coefficient" are close to each other. For example, "Ionization" occurs in a range of 8.7 eV to 22.0, whereas "Electron attachment" occurs at 4.3 eV. Thus, the reaction type and derivative species can be controlled by changing the energy of electrons that collide with $CF_4$.

Although TABLE 1 illustrates only a case of $CF_4$, other gases' reaction type and derivative species can be controlled by controlling the energy of the electrons that collide with the gases.

Next, a reaction mechanism used in the substrate processing method using the substrate processing apparatus according to the embodiment is described below with reference to FIGS. 13 through FIG. 18. FIGS. 13 through 17 illustrate a series of processes using an etching gas for forming a recess in a substrate or a film on a substrate. FIGS. 13 through 17 illustrate a single gas molecule and a single recess for the purpose of illustration. However, actual processes may include a plurality of gas molecules and a plurality of recesses.

FIG. 13 illustrates a process of creating a negative ion. In the process of creating the negative ion, the gas introduction part 50 supplies an etching gas containing a molecule 130 into the chamber 10, and the electron gun arrays 30 emit electrons having energy that is lower than 1 eV to the etching gas (see FIG. 1). By setting the energy of electrons emitted from the electron gun arrays 30 at 1 eV or lower, the electrons attache to the etching gas molecule 130, and a negative ion of the etching gas molecule 130 can be created. At this time, the gas does not dissociate, and the negative ions of the gas molecules 130 can be efficiently created without decomposing the gas molecules 130.

Here, the etching gas is not limited to a specific gas. For example, the etching gas includes a halogen-containing gas such as $CF_4$, $CH_2F_2$, $CHF_3$, $C_4F_8$, c-$C_4F_8$, $Cl_2$, HBr and $SF_6$. When silicon is etched, negative ions of $Cl_2$, HBr or $SF_6$ may be created. When a silicon-oxide film is etched, negative ions containing at least one fluorocarbon molecule such as $CF_4$ or $CHF_3$ may be created.

FIG. 14 illustrates a process of accelerating a negative ion toward a bottom of the recess. In the process of accelerating the negative ion toward the bottom of the recess 151, a positive bias voltage is applied the pedestal 20, and an electric field from the pedestal 20 toward the intermediate electrode 16 is formed. The negative ion of the etching gas molecule 130 travels straight to the bottom surface of the recess 151, and gives negative charge to the bottom surface of the recess 151 when colliding with the bottom surface of the recess 151.

Figure 19:
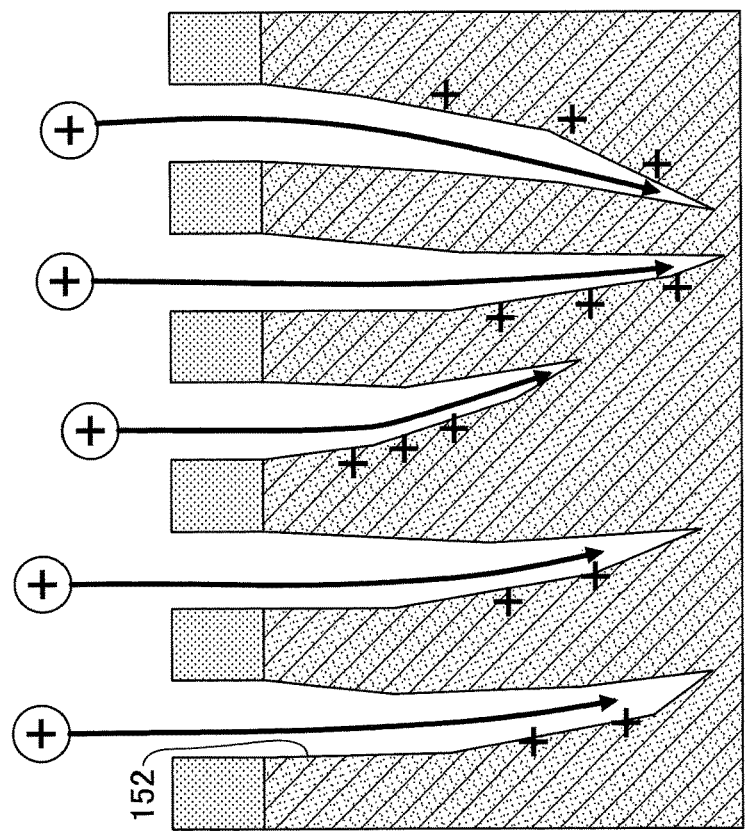
FIG. 19 illustrates a conventional substrate processing method using a conventional substrate processing apparatus.

Here, electrons cannot travel straight because the electrons are influenced by charged substrate (see FIG. 19). In contrast, because the negative ion is unlikely to be influenced by the charged substrate due to its kinetic energy, the negative ion can reach the bottom of the recess 151. Thus, the bottom of the recess 151 can be negatively charged by the negative ion. The negative ion may etch the surface of the recess 151 or may not etch the surface of the recess 131 depending on a relationship among a type of the negative ion and its energy, a type of process, and a type of the substrate.

Figure 15:
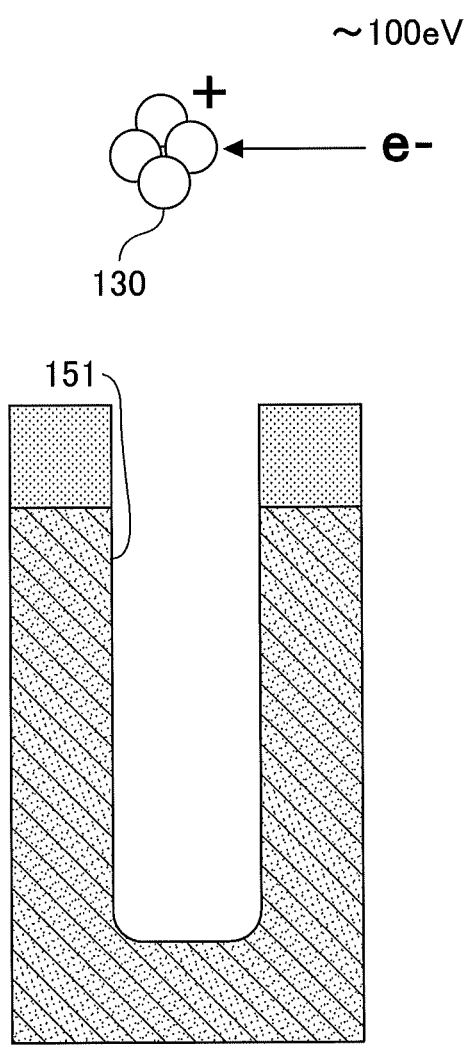
FIG. 15 illustrates a process of creating a positive ion.

FIG. 15 illustrates a process of creating a positive ion. In the process of creating the positive ion, the gas introduction part 50 continues to supply the etching gas containing the molecule 130, and the electron gun arrays 30 emit electrons having energy that can create a positive ion of the etching gas molecule 130 when the electrons collide with the etching gas molecule 130. For example, the energy of the electrons is set lower than 100 eV. The energy of the electrons may be 1 eV or higher and lower than 100 eV, and may be in a range of 10 eV to 50 eV. The energy of the electrons is set at a value that can create the positive ion when the electrons collide with the etching gas molecule 130. The electron gun arrays 30 can readily increase the energy of the electrons by increasing the voltage between the acceleration electrode 37 and the gate electrode 36.

Figure 16:
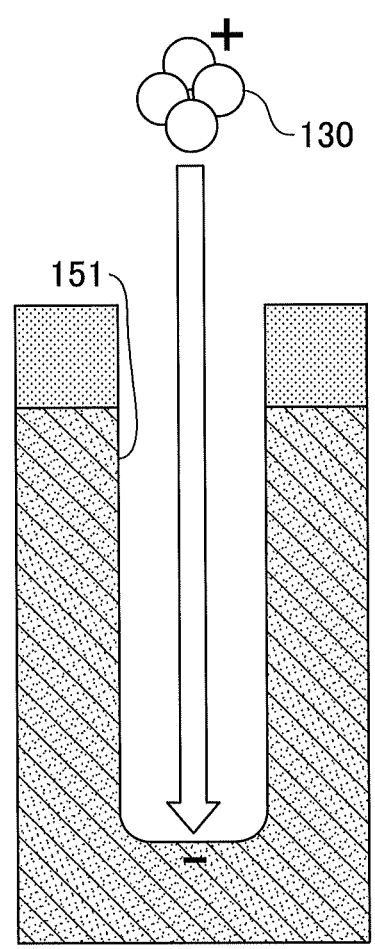
FIG. 16 illustrates a process of accelerating a positive ion toward a bottom of a recess.

FIG. 16 illustrates a process of accelerating a positive ion toward a bottom of a recess. In the process of accelerating the positive ion toward the bottom of the recess 151, the positive ion of the etching gas molecule 130 travels toward the bottom of the recess 151 because the bottom of the recess 151 has negative charge in the process of accelerating the negative ion illustrated in FIG. 14 and because a negative bias voltage is applied to the pedestal 20. The negatively charged bottom of the recess 151 attracts the positive ion of the etching gas molecule 130, and electrically becomes neutral when the positive ion collides therewith because the negative charge is canceled by the positive ion. At this time, the positive ion of the etching gas molecule 130 etches the bottom of the recess 151.

In this process, the pulse power source 90 may apply a negative voltage to the pedestal 20 as necessary. By doing this, the bottom of the recess 151 can attract the positive ion of the etching gas molecule 130 more efficiently by increasing the electric field between the pedestal 20 and the intermediate electrode 16.

Figure 17:
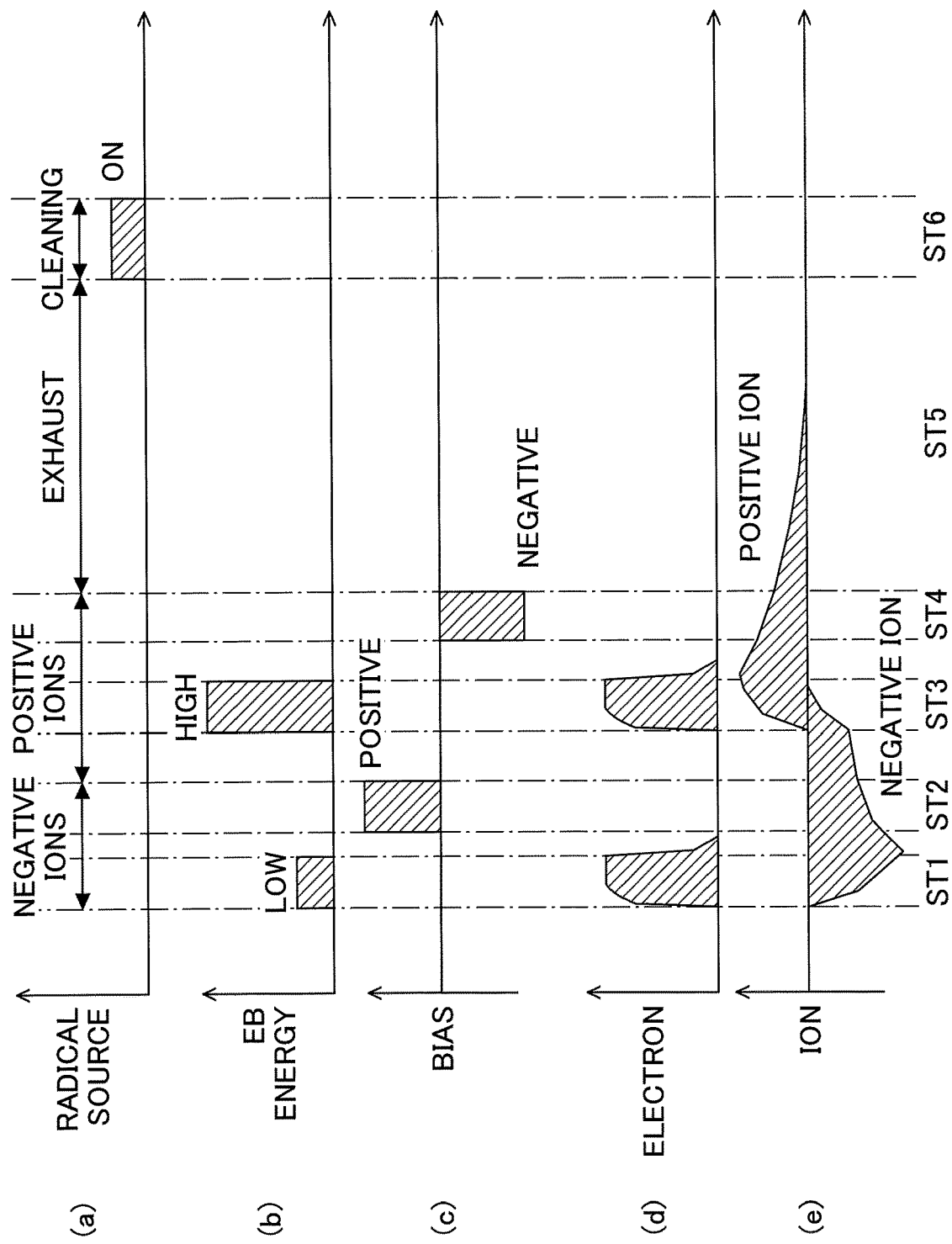
FIG. 17 illustrates an example of a process sequence of the substrate processing method illustrated in FIGS. 12 through 16.

FIG. 17 illustrates an example of a process sequence of the substrate processing method illustrated in FIGS. 12 through 16. FIG. 17(*a*) illustrates a state of a radical source (etching gas). FIG. 17(*b*) illustrates energy of electrons. FIG. 17(*c*) illustrates a bias voltage of the pedestal. FIG. 17(*d*) illustrates an amount of emitted electrons. FIG. 17(*e*) illustrates an amount and a sign of ions of gas molecules. The horizontal axis illustrates a stage of processes.

Figure 20:
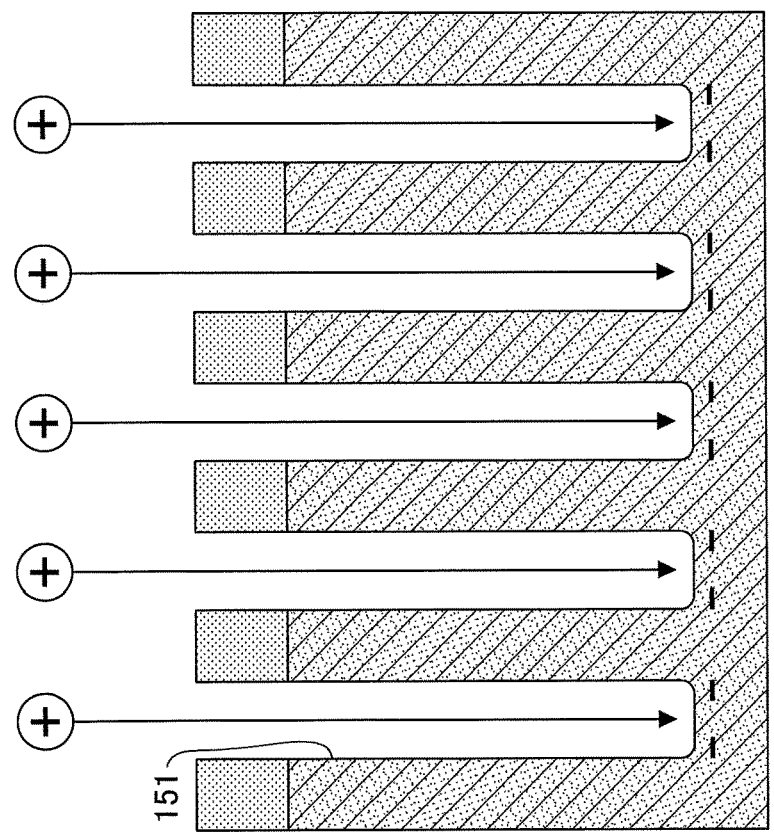
FIG. 20 illustrates a behavior of positive ions of etching gas molecules.

In step ST1, the gas introduction part 50 introduces an etching gas into the chamber 10, and the electron gun arrays 30 emit electrons at low energy as illustrated in FIGS. 20(*b*) and (*d*). Thus, negative ions of the etching gas molecules 130 are created, as illustrated in FIGS. 20(*a*) and (*e*). This stage corresponds to the process in FIG. 13.

In step ST2, the pulse power source 90 applies a positive voltage to the pedestal 20 as illustrated at FIG. 17(*c*). This attracts the negative ions of the etching gas molecules 130 created in step ST1 to the bottom of the recess 151. This stage corresponds to the process in FIG. 14.

In step ST3, the electron gun arrays 30 emit electrons having high energy as illustrated in FIGS. 20(*b*) and (d), thereby creating positive ions as illustrated in FIGS. 20(*a*) and (*e*). This step corresponds to the process in FIG. 15.

In step ST4, the pulse power source 90 applies a negative voltage to the pedestal as illustrated in FIG. 17(*c*). The negatively charged bottoms of the recesses 151 and the pedestal to which the negative voltage applied attract the positive ions of the etching gas molecules 130 created in step ST3. The positive ions collide with the bottoms of the recesses 151.The amount of positive ions decrease as illustrated in FIG. 17(*e*). This step corresponds to the process in FIG. 16.

In step ST5, the vacuum pumps 110 and 111 evacuate the chamber 10, thereby removing a reaction product produced by reaction of the etching gas and the bottoms of the recesses 151. This step corresponds to the process illustrated in FIG. 17.

In step ST6, after finishing the etching process, the controller 120 performs a cleaning process. More specifically, the controller 120 causes a cleaning gas to be introduced into the chamber 10, thereby performing a dry cleaning of the chamber 10.

Thus, the controller 120 can perform the processes by controlling the substrate processing apparatus according to the embodiment. Moreover, the controller 120 can control the electron gun arrays 30 so as to emit electrons having the same energy at any position in one example, thereby performing the uniform substrate process.

Here, the positive bias voltage and the negative bias voltage can be sequentially applied to the pedestal 20. For example, the controller 120 may cause the pulse frequency power source 90 to apply the positive bias voltage to the pedestal 20 first, and then the negative bias voltage to the pedestal 20 as illustrated in FIG. 17(*c*) while adjusting the frequency of the pulse power source 90. Otherwise, for example, the controller 120 may cause the pulse frequency power source 90 to apply the negative voltage to the pedestal 20 first, and then the positive voltage while adjusting the frequency of the pulse source 90. More specifically, as illustrated in FIGS. 17(*c*) and 17(*e*), the substrate processing apparatus generates ions with different signs (FIG. 17(*e*)), and applies the bias voltages with signs opposite to the signs of the ions to the pedestal 20 while being timed for the generation of the ions (FIG. 17(C)).

Moreover, the controller 120 may cause the pulse frequency power source 90 to apply the positive bias voltage and the negative bias voltage in a variety of sequences. For example, the controller 120 may cause the pulse frequency power source 90 to apply the positive bias voltage, the positive bias voltage, and the negative bias voltage to the pedestal 20 in this order. In this case, the controller 120 causes the electron gun arrays 30 to generate negative ions, negative ions, and positive ions in this order while being timed for the application of the bias voltages so that the generated ions and the bias voltages have the opposite signs to each other. More specifically, in this case, the controller 120 causes the electron gun arrays 30 to emit electrons with low energy, low energy, and high energy in this order to generate the negative ions, the negative ions, and the positive ions in this order. By doing this, the pedestal 20 attracts the generated ions in accordance with the signs of the generated ions, thereby processing the substrate 150 on the pedestal 20.

Similarly, for example, the controller 120 may cause the pulse frequency power source 90 to apply the negative bias voltage, the negative bias voltage, and the positive bias voltage to the pedestal in this order. In this case, the controller 120 causes the electron gun arrays 30 to generate positive ions, positive ions, and negative ions in this order while being timed for the application of the bias voltages so that the generated ions and the bias voltages have the opposite signs to each other. More specifically, in this case, the controller 120 causes the electron gun arrays 30 to emit electrons with high energy, high energy, and low energy in this order to generate the positive ions, the positive ions, and the negative ions in this order.

Thus, as long as the generated ions and the bias voltages applied to the pedestal 20 have the opposite signs at the same timing, the controller 120 may perform a variety of sequences to process the substrate 150 on the pedestal 120.

Figure 18:
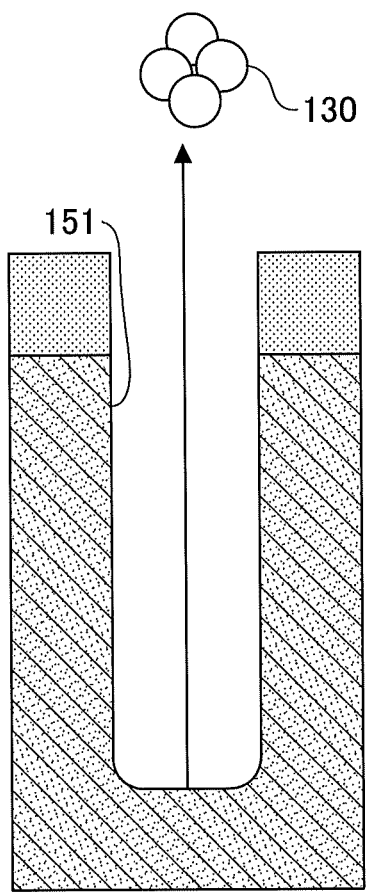
FIG. 18 illustrates a process of evacuating a reaction product.

FIG. 18 illustrates a process of evacuating a reaction product. In the process of evacuating the reaction product, the vacuum pumps 110 and 111 evacuate the chamber 10, and the reaction product produced by the reaction between the etching gas and the bottom of the recess 151 is removed from the chamber 10.

The controller 120 performs the series of processes illustrated in FIGS. 12 through 16 by controlling the substrate processing apparatus, thereby etching the recess 151 deeply.

In the processes of creating the negative ion illustrated in FIG. 13 and creating the positive ion illustrated in FIG. 15, the energy of the electrons can be made uniform by adjusting the acceleration voltage (Vga) of the electron gun arrays 30 at each position.

Thus, the substrate processing method using the substrate processing apparatus according to the embodiment can achieve the deep etching to form a recess such as a trench or a via-hole having a high aspect ratio.

FIG. 19 illustrates a conventional substrate processing method using a conventional substrate processing apparatus. In the conventional substrate processing method, recesses 152 are difficult to be etched vertically because the conventional substrate processing method etches the recesses 152 by using only positive ions, it is difficult to cancel positive charge of the recesses 152. Thus, the recesses 152 are positively charged, and the positive ions of the etching gas molecules cannot travel straight, thereby forming curved recesses 152 by the etching.

FIG. 20 illustrates a behavior of positive ions of etching gas molecules. As illustrated in FIG. 20, positive ions can travel straight because the bottoms of the recesses 151 are negatively charged, thereby attracting the positive ions. Thus, the substrate processing method using the substrate processing apparatus according to the embodiment can achieve the straight deep etching.

Figure 21:
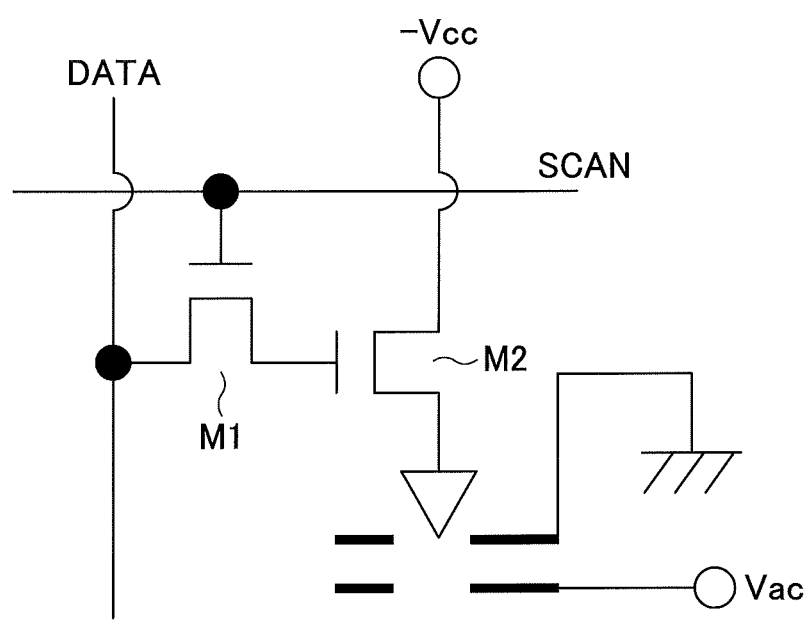
FIG. 21 illustrates a drive circuit of the electron gun arrays.

FIG. 21 illustrates a drive circuit of the electron gun arrays 30. As illustrated in FIG. 21, the drive circuit used for a display can be applied to the electron gun arrays 30. When a data signal is input to a data line, a voltage is applied to a scan line, transistors M1 and M2 are turned on, and the electron gun array 30 is turned on. To drive the electron gun arrays 30, such an active matrix drive type switching circuit can be applied, for example. However, the drive circuit is not limited to this circuit, and another circuit can be also applied to drive the electron gun arrays 30 depending on the intended use.

All examples and conditional language recited herein are intended for pedagogical purposes to aid the reader in understanding the invention and the concepts contributed by the inventors to furthering the art, and are to be construed as being without limitation to such specifically recited examples and conditions, nor does the organization of such examples in the specification relate to a showing of the superiority or inferiority of the invention. Although the embodiments of the present inventions have been described in detail, it should be understood that various changes, substitutions, and alterations could be made hereto without departing from the spirit and scope of the invention.

What is claimed is:

1. A substrate processing apparatus, comprising:
   a chamber;
   a pedestal provided in the chamber and having a substrate holding region to hold a substrate thereon;
   a gas supply part to supply a gas into the chamber;
   a plurality of electron gun arrays two-dimensionally arranged so as to cover the substrate holding region and configured to emit electrons toward the gas to cause interactions between the emitted electrons and the gas; and
   a plurality of electron energy control parts correspondingly provided at each of the electron gun arrays and configured to control energy of the electrons emitted from each of the electron gun arrays independently of each other,
   wherein each of the electron gun arrays comprises:
   a plurality of two-dimensionally arranged cathodes configured to emit electrons;
   a gate electrode provided around each of the cathodes and configured to have a first potential that is higher than that of each of the cathodes to cause each of the cathodes to emit electrons;
   a current control part connected between a node to which the cathodes are connected and the gate electrode, and configured to control a current flowing from the node of the cathodes to the gate electrode by changing a voltage applied between the node of the cathodes and the gate electrode; and
   an acceleration electrode provided in front of the gate electrode corresponding to each of the cathodes and configured to have a second potential that is higher than the first potential to accelerate the electrons emitted from each of the cathodes,
   wherein each of the electron energy control parts is configured to control energy of the electrons emitted from each of the cathodes by controlling a voltage applied between the acceleration electrode and the gate electrode independently of the current control part.

2. The substrate processing apparatus according to claim 1, wherein the chamber includes a gas excitation section that contains the gas supply part, the gas electron gun arrays and the electron energy control parts, and a substrate processing section that contains the pedestal.

3. The substrate processing apparatus according to claim 2, wherein the gas supply part is provided in a side wall of the chamber.

4. The substrate processing apparatus according to claim 2, wherein the gas supply part is provided between the electron gun arrays adjacent to each other.

5. The substrate processing apparatus according to claim 2, further comprising:
   a voltage source configured to apply a bias voltage to the pedestal to attract reactive species of the gas from the gas excitation section toward the pedestal.

6. The substrate processing apparatus according to claim 1, wherein the electron gun arrays are arranged on a top wall of the chamber in a matrix form.

7. The substrate processing apparatus according to claim 1,
wherein the current control part includes a first variable direct-current power source, and
wherein the acceleration energy control part includes a second variable direct-current power source.

8. The substrate processing apparatus, according to claim 7,
wherein each of the cathodes is provided on a conductive pattern connected to a negative terminal of the first variable direct-current power source,
wherein the gate electrode is made of a conductive plate having a plurality of openings arranged correspondingly around each of the cathodes and connected to a positive terminal of the first variable direct-current power source and a negative terminal of the second variable direct-current power source, and
wherein the acceleration electrode is made of a conductive plate having a plurality of openings arranged corresponding to the plurality of openings of the gate electrode and connected to a positive terminal of the second variable direct-current power source.

9. The substrate processing apparatus according to claim 1, wherein the plurality of two-dimensionally arranged cathodes are arranged in a matrix form.

10. A substrate processing apparatus, comprising:
a chamber;
a pedestal provided in the chamber and having a substrate holding region to hold a substrate thereon;
a gas supply part to supply a gas into the chamber;
a plurality of electron gun arrays two-dimensionally arranged so as to cover the substrate holding region and configured to emit electrons toward the gas to cause interactions between the emitted electrons and the gas;
a plurality of electron energy control parts correspondingly provided at each of the electron gun arrays and configured to control energy of the electrons emitted from each of the electron gun arrays independently of each other;
a controller configured to control the electron energy control parts so as to set the energy of the electrons to a first energy such that the gas supplied into the chamber becomes negative ions by interactions between the electrons and the gas and then to set the energy of the electrons to a second energy such that the gas supplied into the chamber becomes positive ions by interactions between the electrons and the gas.

11. The substrate processing apparatus according to claim 10,
wherein each of the electron gun arrays comprises:
a plurality of two-dimensionally arranged cathodes configured to emit electrons;
a gate electrode provided around each of the cathodes and configured to have a first potential that is higher than that of each of the cathodes to cause each of the cathodes to emit electrons;
a current control part connected between a node to which the cathodes are connected and the gate electrode, and configured to control a current flowing from the node of the cathodes to the gate electrode by changing a voltage applied between the node of the cathodes and the gate electrode; and
an acceleration electrode provided in front of the gate electrode corresponding to each of the cathodes and configured to have a second potential that is higher than the first potential to accelerate the electrons emitted from each of the cathodes,
wherein each of the electron energy control parts is configured to control energy of the electrons emitted from each of the cathodes by controlling a voltage applied between the acceleration electrode and the gate electrode independently of the current control part.

12. The substrate processing apparatus according to claim 11, further comprising:
a voltage source configured to apply a bias voltage to the pedestal to accelerate the excited gas from the gas excitation section toward the pedestal,
wherein the chamber includes a gas excitation section that contains the gas supply part, the gas electron gun arrays and the electron energy control parts, and a substrate processing section that contains the pedestal,
wherein the controller causes the voltage power source to apply a positive bias voltage to the pedestal in response to generation of the negative ions of the gas, and causes the voltage power source to apply a negative bias voltage in response to generation of the positive ions of the gas.

13. The substrate processing apparatus according to claim 10, wherein the controller sets the first energy lower than 1 eV and sets the second energy higher than 1 eV.

14. A substrate processing apparatus, comprising:
a chamber;
a pedestal provided in the chamber and having a substrate holding region to hold a substrate thereon;
a gas supply part to supply a gas into the chamber;
a plurality of electron gun arrays two-dimensionally arranged so as to cover the substrate holding region and configured to emit electrons toward the gas to cause interactions between the emitted electrons and the gas;
a current control part configured to control a current value flowing through each of the electron gun arrays;
a current measurement unit configured to measure the current value flowing through each of the electron gun arrays;
a plurality of electron energy control parts correspondingly provided at each of the electron gun arrays and configured to control energy of the electrons emitted from each of the electron gun arrays independently of each other; and
a controller configured to perform the flowing steps, including:
causing the current measurement unit to measure the current value of each of the electron gun arrays while measuring a voltage value of both ends of the current measurement unit;
obtaining the current-voltage characteristics of each of the electron gun arrays;
determining an extraction voltage of each of the electron gun arrays such that the current value of each of the electron gun arrays becomes constant; and
setting an acceleration voltage of each of the electron gun arrays to a certain voltage.

15. The substrate processing apparatus as claimed in claim 14,
wherein the current control part is constituted of a first variable direct current power source, and the controller sets an output voltage of the first variable direct current power source to the extraction voltage, and
wherein the electron energy control part is constituted of a second variable direct current power source, and the controller sets an output voltage of the second variable direct current power source to the acceleration voltage.

16. The substrate processing apparatus as claimed in claim 15,
wherein the controller sets the acceleration voltage to a first voltage that causes the electrons emitted from the electron gun arrays to have energy that changes the gas into negative ions by colliding therewith.

17. The substrate processing apparatus as claimed in claim 16, further comprising:
a voltage source configured to apply a bias voltage to the pedestal to accelerate the excited gas from the gas excitation section toward the pedestal,
wherein the chamber includes a gas excitation section that contains the gas supply part, the gas electron gun arrays and the electron energy control parts, and a substrate processing section that contains the pedestal,
wherein the controller causes the voltage power source to apply a positive bias voltage to the pedestal in response to generation of the negative ions of the gas, thereby attracting the negative ions to the substrate disposed on the pedestal.

18. The substrate processing apparatus as claimed in claim 17, wherein the controller changes the acceleration voltage set by the second variable direct current power source from the first voltage to a second voltage that is higher than the first voltage so as to cause the electrons have energy to change the gas into positive ions.

19. The substrate processing apparatus as claimed in claim 18, wherein the controller causes the voltage power source to apply a negative bias voltage to the pedestal in response to generation of the positive ions of the gas, thereby attracting the positive ions to the substrate disposed on the pedestal.

* * * * *